(12) United States Patent
Schedel et al.

(10) Patent No.: US 6,684,124 B2
(45) Date of Patent: Jan. 27, 2004

(54) METHOD FOR CONTROLLING A PROCESSING DEVICE FOR A SEQUENTIAL PROCESSING OF SEMICONDUCTOR WAFERS

(75) Inventors: Thorsten Schedel, Dresden (DE); Karl Schumacher, Dresden (DE); Thomas Fischer, Dresden (DE); Heiko Hommen, Dresden (DE); Ralf Otto, Kesseldorf (DE); Sebastian Schmidt, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/134,106

(22) Filed: Apr. 29, 2002

(65) Prior Publication Data
US 2002/0183879 A1 Dec. 5, 2002

(30) Foreign Application Priority Data
Apr. 27, 2001 (DE) ......... 101 20 701

(51) Int. Cl.$^7$ ............ G06F 19/00
(52) U.S. Cl. ............ 700/121; 700/110
(58) Field of Search ............ 700/108–110, 121; 702/179, 182–185, 81–84; 382/145

(56) References Cited

U.S. PATENT DOCUMENTS

| | | | |
|---|---|---|---|
| 4,571,685 A | 2/1986 | Kamoshida | |
| 5,896,294 A | 4/1999 | Chow et al. | |
| 5,987,398 A | 11/1999 | Halverson et al. | 702/179 |
| 6,041,270 A | 3/2000 | Steffan et al. | 700/121 |
| 6,090,632 A | 7/2000 | Jeon et al. | |
| 6,120,348 A | 9/2000 | Fujita et al. | |
| 6,162,006 A | 12/2000 | Stevens et al. | 414/416.03 |
| 6,363,294 B1 * | 3/2002 | Coronel et al. | 700/121 |
| 6,405,094 B1 * | 6/2002 | Ueda et al. | 700/112 |

FOREIGN PATENT DOCUMENTS

| | | |
|---|---|---|
| DE | 100 24 749 A1 | 12/2000 |
| EP | 0 883 030 A2 | 1/1998 |
| EP | 0 859 406 A2 | 8/1998 |
| EP | 0 932 194 A1 | 7/1999 |
| JP | 11 345 752 | 12/1999 |
| WO | WO 01/11678 A1 | 2/2001 |

* cited by examiner

*Primary Examiner*—Leo Picard
*Assistant Examiner*—Ryan Jarrett
(74) *Attorney, Agent, or Firm*—Laurence A. Greenberg; Werner H. Stemer; Gregory L. Mayback

(57) ABSTRACT

While a first leading semiconductor wafer (11) already processed in a process appliance (1) and belonging to a batch is being measured in a microscope measuring instrument (2) in relation to values for the structure parameters 30, a second or further semiconductor wafer (12) belonging to the batch is processed in the process appliance (1). An event signal (100) reports, for example, an inspection carried out successfully of the first wafer, so that the following wafers (12) no longer need to be inspected. Using the measured results, the process parameters (31) of the process appliance (1) are automatically readjusted. Events such as maintenance work or parameter drifts in trend maps etc. are detected in control units (8 or 9) and, via the output of an event signal (102), for example in an event database (40), lead to the event-based selection of structure parameters (30') to be measured and/or to the initiation of a leading wafer (11). Limiting-value violations (21) of at least one process parameter (31), detected by a control unit (8), are responded to by a warning signal (101) and likewise fed into the event database (40).

11 Claims, 4 Drawing Sheets

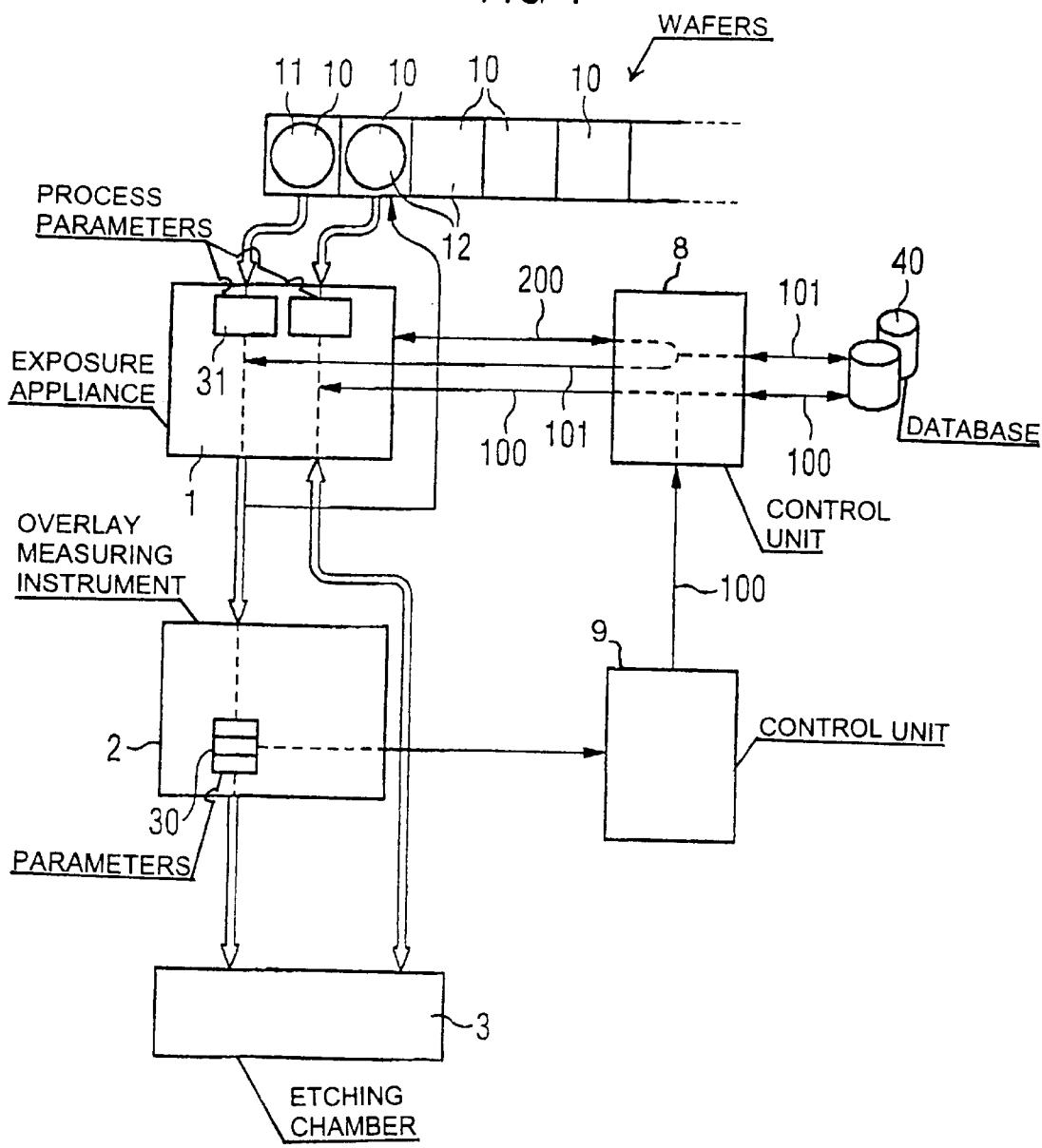

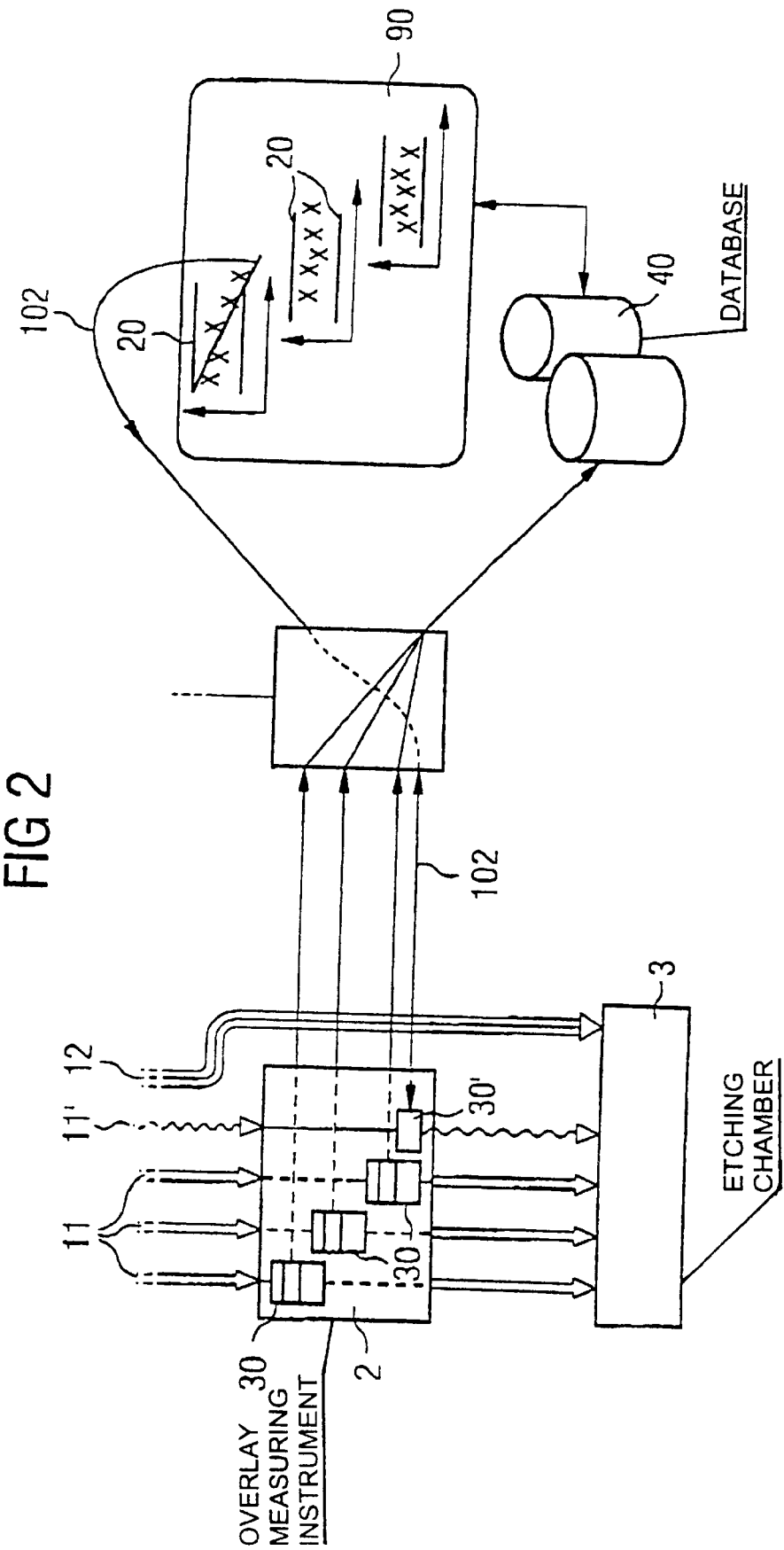

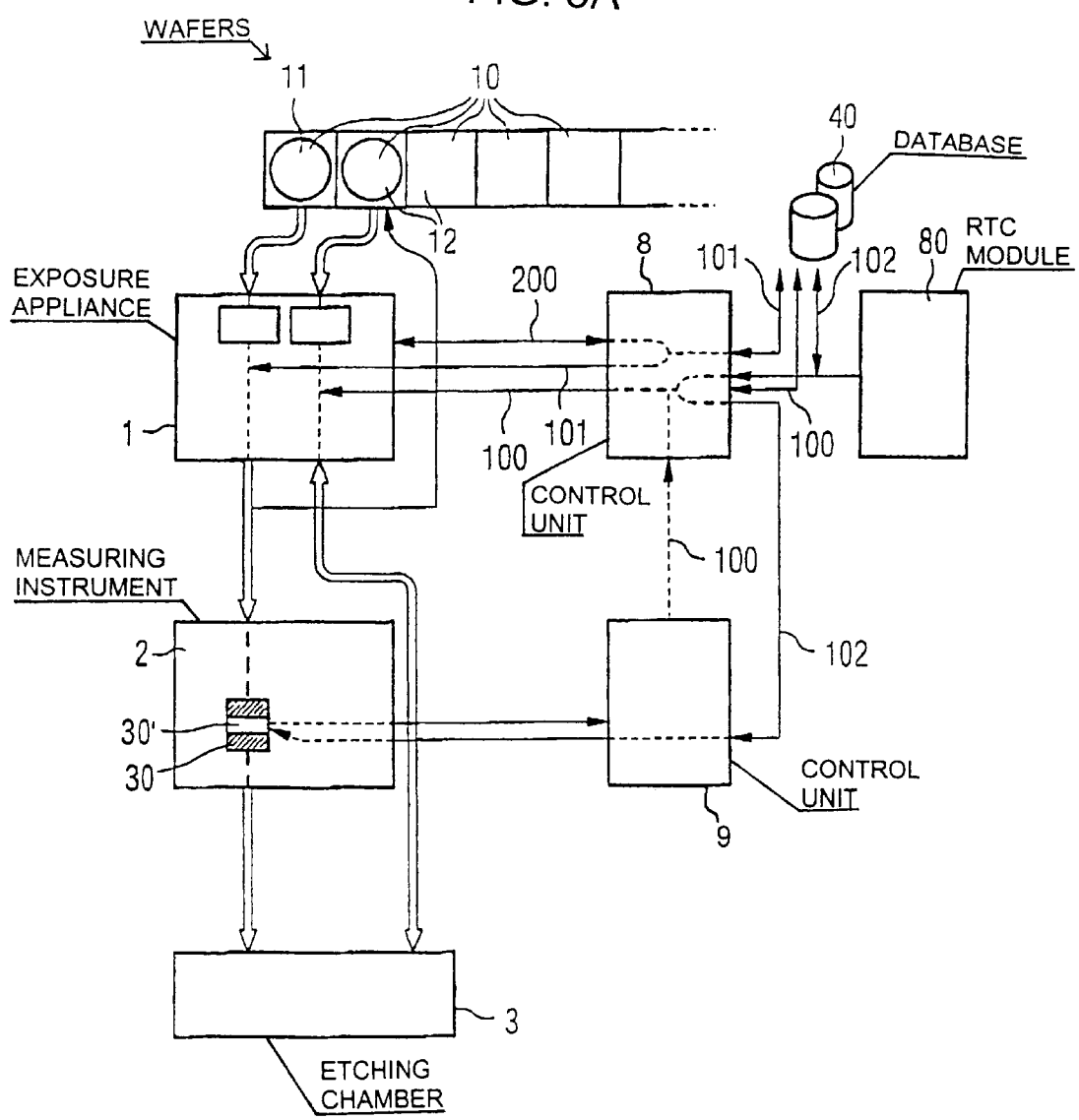

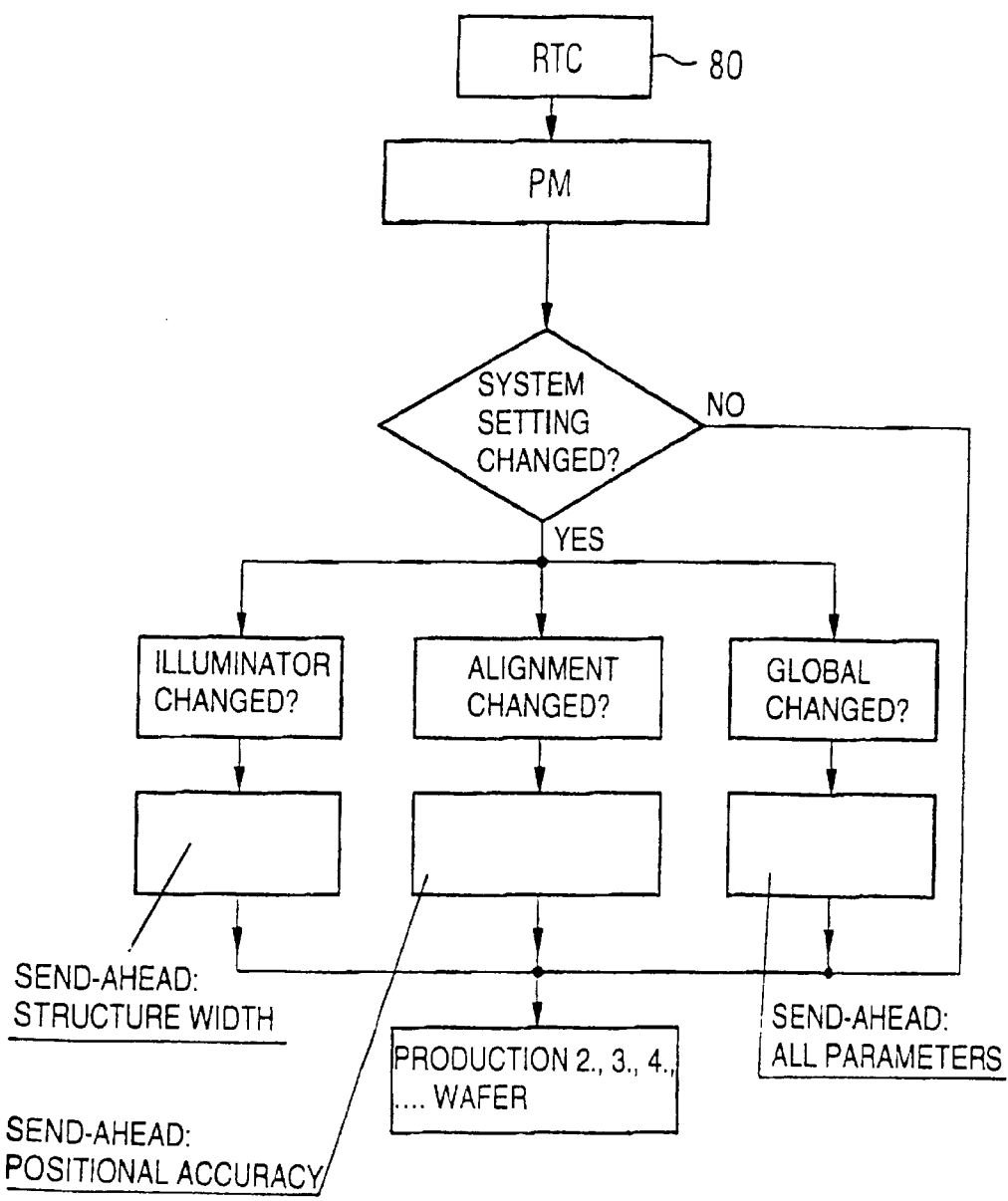

METHOD FOR CONTROLLING A PROCESSING DEVICE FOR A SEQUENTIAL PROCESSING OF SEMICONDUCTOR WAFERS

BACKGROUND OF THE INVENTION

Field of the Invention

The present invention relates to a method of controlling a process appliance for the sequential processing of a number of semiconductor wafers, using at least one micro measuring instrument to determine the quality of the process carried out in the process appliance.

During the production of semiconductor products with a widely branched chain of individual production steps, one main focus of attention in relation to cost efficiency lies in the optimal utilization of the existing process appliances, with a simultaneously high quality of the products.

In this case, the optimal utilization in a fabrication shop is normally ensured by an internal factory planning system (CIM, Computer Integrated Manufacturing), while the quality is normally monitored by the measuring instruments following the respective process in conjunction with various methods of evaluation.

Silicon wafers count as a typical example of semiconductor products. As a rule, there are large numbers of wafers to be processed in the same way. "In the same way" here means identical chemical and physical characteristics—in particular of the surface, for example structure sizes or layout compositions. Because of identical process conditions, the wafers to be processed in the same way are combined into groups and are processed one after another, that is to say sequentially, or in parallel chambers in process appliances for the respective fabrication step. Wafers passing jointly through the individual fabrication steps—normally combined into wafer carriers, as they are known—are referred to as a batch which, for example, can consist of 25 wafers. If such a batch passes to the input of a process appliance, then the wafers contained briefly form a batch queue, also referred to merely as a "batch" below, because of the processing, which is often possible only sequentially.

The finally processed, for example 25 wafers, are normally combined again and are fed to one or more measuring instruments to measure the quality of the process just carried out. For this purpose, a number of different types of microscope measuring instruments are used in the semiconductor industry. Designated by this term in this document are optical microscope measuring instruments, and those operating in the ultraviolet, for measuring the positional accuracy or structure sizes etc., but also microscopes in the wider sense, such as a scanning electron microscope (SEM), or AFM (Atomic Force Microscope), or else measuring instruments operating with interference, such as layer thickness measuring instruments, particle counters etc., or in general terms defect inspection instruments. This corresponds to the English language designation "metrology tools" which is usual in the semiconductor industry.

Various process-relevant parameters are measured during such an inspection, the methods of statistical process control (SPC) normally being applied nowadays for the selection. Because not every batch or each product batch is inspected, but instead randomly selected entities are measured in accordance with statistical methods, on the one hand additional capacity of the abovementioned microscope measuring instrument can advantageously be released. If problems occur for example measured values lying close to specification limits—the statistical samples can be adapted dynamically.

On the other hand, measured value histories can also be monitored, in order to be able to establish characteristic system trends of the process appliance, such as systematic parameter displacements and violations of limiting values which may possibly result from these and manifest themselves. Likewise, by averaging as a function of the time, systematic measured value jumps can be determined from the history, which are then compared with results from the process appliance history.

Using the findings obtained from this, the process parameter adjustments of the process appliance considered can be readjusted or optimized.

In this case, it is a disadvantage that these optimizations can take effect only on the next batch brought up to the process appliance or, respectively, the wafers belonging to said batch. For the batch which has just been processed it is true, firstly, that in the event of system errors occurring in the process appliance, all contained are affected as a whole and therefore have to be sent to rework, that is to say reprocessing. For this reason, additional costs arise and the yield can decrease disadvantageously.

On the other hand, effects that act only on individual wafers can be overlooked by the manner of statistical sampling. Furthermore, it is not ensured that the assumption that the process optimizations consequent on the batch currently being processed are subject to the same conditions as for the following batch is justified.

Another method constitutes that from a preceding wafer. Before the actual production batch of wafers is started, a precursor, normally functioning as a test wafer, is processed and is then transferred as quickly as possible to the metrology tool, after which the process parameters of the process appliance can then be adjusted for the following. This method has the particular disadvantage that not only is it necessary for the wafers of the batch to wait for the measurement of the precursor and as a result be processed later, but also an unproductive time has to be kept free for the process appliance itself.

SUMMARY OF THE INVENTION

It is therefore the object of the present invention to increase the proportion of useful time of process appliances for semiconductor fabrication, to reduce the production time of semiconductor products and to improve the yield in the process appliances.

The object is achieved by a method of controlling a process appliance for the sequential processing of a number of semiconductor wafers, using at least one microscope measuring instrument for determining the quality of the process carried out in the process appliance, target and limiting values for structure parameters on the wafer being predefined, comprising the steps of: processing a first wafer in the process appliance, transferring the wafer to the microscope measuring instrument, measuring structure parameters of structures formed or modified on the wafer in the process, processing a second wafer during the measurement of the first wafer, comparing the measured values of the structure parameters with the predefined target and limiting values, generating a result signal as a function of the comparison result, and transmitting the signal to the process appliance.

According to the present method, a first leading wafer is processed in a process appliance and then transferred to a microscope measuring instrument to measure the structure parameters. Process appliance includes all the appliances which are normally used in semiconductor production and which perform chemical or physical changes in or on the wafer or the substrate. These therefore include in particular all appliances in the lithography sequence, etching chambers, developers, CMP appliances, ovens, implanters, deposition tools (CVD, PVD, PECVD, etc.) and more of the like. Designated microscope measuring appliances are—as mentioned at the beginning—all optical or ultraviolet illuminating microscope types, adjustment measuring instruments, scanning electron microscopes, AFM and also instruments operating interferometrically or acoustically for measurements of position, layer thickness, inclination angle or structure widths.

The present invention permits the processing of a second wafer from the batch, during sequential processing, directly after the conclusion of the process for the first wafer. The time during which the first wafer processed would have to wait for the fabrication of the second wafer is advantageously used for the inspection or measurement of the metrology parameters which necessarily have to be measured for the quality of the process respectively carried out.

The advantage accordingly resides in the fact that the preceding wafer neither has to be separated from the batch as a test wafer and subsequently disposed of, the remaining quantity of wafers in the batch waiting unprocessed for the measurement and the measured results, nor that all the wafers in the batch have to be processed in order then to be measured from statistical points of view. The associated disadvantage, that all the wafers of the batch can be impaired in terms of their quality by, for example, unsuitably adjusted system or process parameters of the process appliance, is removed according to the present invention. This is because the measured results returning from the leading wafer can be used for a correction or optimization of the process parameter adjustment of the process appliance during the processing of a second wafer of the batch. In this document, the second wafer does not necessary refer to the second wafer in the processing sequence but to any desired further wafer in the processing sequence. At which second wafer in the sequence the measured results from the leading wafer enter and become effective in a process of optimization depends on the level of automation of the transport path, the number of structures which have to be measured, and the number of microscope measuring instruments for measuring the structure parameters. Modern transport systems and clean-room subdivisions, that is to say arrangements of process appliances and metrology tools, may already permit sufficiently fast feedback to the appliance control system, however.

The comparison of measured structure parameters with predefined limiting values can be carried out in a conventional way. In the case of the result signal, there are various possible formations, for example a data input which is input into appropriate databases via an installed bus system belonging to the internal factory CIM or MES system (Manufacturing Execution System), from which database it is ready to be called by means of appliance hosts, that is to say the control unit of the process appliance. Alternatively, within the same context of the MES system, it is transmitted directly to the control unit of the process appliance as a programming event. The result signal can accordingly comprise a sequence of data elements containing measured results or else only a yes/no verification of compliance with predefined limiting values or specifications. The critical factor is that the result signal can be used to trigger the further fabrication path of the second wafer.

The advantage arises in particular when the result of the measurement comparison is positive, so that by means of the result signal, the second and further wafers do not also have to be subjected to a measurement, but can be fed directly to following processes. At the same time, by using the information, a process parameter adjustment of the process appliance can be improved recursively.

In this way, the utilization of the process appliance is improved, the production of semiconductor products is accelerated and the yield during production is increased.

In a further refinement of the present invention, a mechanism for initiating the measurement of a leading wafer is considered. The chemical or physical process parameters that influence the processing of the wafer, such as temperature, chemical composition, process duration, intensity, pressure etc., are followed in the process appliance and recorded. If the recorded values exceed the process limiting value associated with a process parameter, which may also depend on the wafer specification, then a warning signal is generated for this purpose and is preferably provided by an appropriate database entry for the relevant wafer. From a batch, for example the wafer provided with the corresponding flag is then selected as the leading, first wafer, that is to say provided for the measurement. By means of this method, which can be designated APC (Advanced Process Control) in analogy with SPC, the wafers counted as particularly critical can be prepared for the measurement from the start. This is because process conditions running outside the limiting values can often lead to corresponding violations of the wafer specification. By means of this APC method in combination with a leading wafer, the yield for the corresponding process appliance is additionally increased.

In a further refinement, a further advantage of time saving is achieved by means of application and combination with SPC methods. By drawing up trend maps, as they are known, that is to say recordings of measured values of various structure parameters through the microscope measuring instrument and plotting against time, trends can be determined or sudden jumps in the process conditions can be determined retroactively or predictively in the first case. In interplay with the present invention, this method becomes particularly advantageous if, on the basis of such a calculation, a signal describing this event is generated and is evaluated for the further planning of the fabrication path of the second and further following wafer. The event reported therefore corresponds, for example, to a process parameter drift or a jump established as a result of external influences on the process appliance. This event will preferably be entered into an event database or reported directly to the internal factory planning system (MES). The objective in this case is to examine a further leading wafer in such a way that it is precisely only the structure parameter that characterizes the drift or jump problem that is measured for the wafer.

On the one hand, the time-consuming measurement of structure parameters that are not relevant to this problem is advantageously dispensed with as a result, on the other hand, in the standard case, it may be possible to obtain structure parameters that have not necessarily been measured, by initiating the appropriate measurement.

In a further refinement, the generation of an event signal for an activity connected with repair or maintenance is produced. Following work of this type on the process appliance, such as the replacement of system parts, process parameters or their adjustments are generally changed. As a result, corresponding jumps of structure parameters measured in the microscope measuring instrument are to be expected, so that in accordance with this refinement, a first measurement is advantageously initiated by a leading wafer. Repair or maintenance activities substantially fall under the categories "scheduled down", "unscheduled down", "preventive maintenance", etc. The corresponding planning tasks are managed by the object module (RTC, Resource Tracking Control) of the internal factory CIM or MES systems. Corresponding planned or unplanned events are reported on appropriate bus systems and—as in the case of combining the invention with SPC methods—can be used causally for the selection of suitable structure parameters of the leading wafer for the measurement in the microscope measuring instrument.

Further refinements of the invention are specified in the subclaims.

The invention will be explained in more detail below using three exemplary embodiments and drawings.

BRIEF DESCRIPTION OF THE DRAWINGS

FIG. 1 shows the schematic representation of a method sequence according to the invention, using a first example, FIG. 2 shows the schematic representation of the method sequence according to the invention of a second example, with a result generated by the SPC module, FIG. 3 shows the schematic representation of the method sequence according to the invention of a third example, with an event generated by the RTC module (a), and an exemplary flow diagram (b).

DESCRIPTION OF THE PREFERRED EMBODIMENTS

A first example according to the invention of a method of controlling a process appliance 1 is shown in FIG. 1. A batch of semiconductor wafers 10 is ready to be processed in the wafer exposure appliance 1 and for subsequent measurement in the overlay measuring instrument 2, which is followed by an etching chamber 3 as a following process. The process parameters 31 characterizing the process conditions in the exposure appliance 1 are measured and/or readjusted by a control unit 8 associated with the exposure appliance 1, via a signal line 200. Also associated with the overlay measuring instrument 2 is a control unit 9, which monitors the measurement and records and stores the measured values of the structure parameters 30 of the respective wafer.

In this and in following figures, broadly drawn arrows designate the physical flow of wafers 10 through the individual process steps, while narrowly drawn arrows designate signals in the information or command flow.

A first wafer from the batch of semiconductor wafers 10 is selected as the leading wafer 11 and exposed with the structure of a mask in the exposure appliance 1. The exposure appliance 1 comprises only one exposure chamber, so that it is always only one wafer 10 which can be processed sequentially. Following completion of the exposure step, the wafer is output and moved directly by an automatic transport system to the overlay measuring instrument 2 for further measurement. In the process chamber of the exposure appliance 1, which becomes free, a second semiconductor wafer 12 is introduced immediately in order to carry out the same exposure step. During this exposure of the second wafer 12, the first wafer 11 is examined for the structure parameters comprising positional accuracy and structure width at various measurement points in each case. In the control unit 9, the measured values are compared with the specification values stored in a product database for this wafer product. For the current product, the result is a low average deviation from the target value, but within the predefined limiting values or specification. The control unit 9 generates an event signal 100 from this, which is stored in the event database 40. The corresponding flag is assigned in the tables of the remaining second and further semiconductor wafers 12, so that the fabrication control system (CIM system), after completing the lithography step for the second wafer 12, feeds the latter via the transport system, together with the first wafer 11, to the subsequent etching step 3, said wafers being collected in the batch container and the latter being provided for etching.

The leading wafer 11 does not necessarily have to be the first wafer in the chronological or logical sequence of a batch or wafer carrier. It can also be activated during the processing of the batch as such, for example by an event which makes a new inspection necessary. In the present notation, the new, leading wafer is then the first wafer 11 and a further, following wafer of the batch corresponds to the second wafer 12.

Via the signal line 200, the control unit 8 monitors the process parameters 31 with which the wafers 11, 12 are processed in each case. For the exposure appliance 1, the control unit 8 has tolerance values for this wafer product. The process parameters 31 correspond, for example, to the hot- and cooling-plate parameters preceding and following the exposure appliance 1 in the lithography cluster.

In this exemplary embodiment, before the beginning of the processing of the batch, the question as to whether the semiconductor wafer 11 was subsequently to be inspected in the overlay measuring instrument 2 was still open. As a result of the stored temperature limiting value of the process parameter 31, temperature, being exceeded, a corresponding flag for the wafer 11 is set in the event database 40 by control unit 8 via a warning signal 101. As a result, the fabrication control system is informed that the semiconductor wafer 11 must be examined in the overlay measuring instrument 2 with respect to structure widths.

A further example according to the invention of the method of controlling the process appliance 1 is shown in FIG. 2. There, a series of wafer batches has already been produced, in each case with a leading wafer 11, and inspected in accordance with the method shown in the exemplary embodiment 1. In the overlay measuring instrument 2, in each case the structure parameters 30 "shift", "scaling" and "magnification" of the exposed fields have been measured. The control unit 9 enters these values into a database 40 and produces a trend map for the parameters, in each case from the history, in accordance with the SPC method. Although the measured values in each case lie within the tolerance limits 20, a disadvantageous trend is calculated by the control unit 9, from which an event signal 102 is generated. This flag, stored in the event database 40, is read out for the next leading wafer 11', as a result of which the control unit 9 examines this wafer 11' only for the structure parameter 30'. According to the invention, the start of the leading wafer 11' can also be initiated by the control unit 9 on the basis of the establishment of the trend with the event signal 102—transmitted by control unit 8.

As a result of saving the shift and magnification measurement, free measurement capacity in the overlay measuring instrument 2 is increased, and the fabrication time is advantageously shortened.

A further example according to the invention of the method of controlling a process appliance 1 is shown in FIG. 3. An RTC module 80 has notified maintenance (Preventive Maintenance, PM) for the exposure appliance 1, its conclusion being notified by an event signal 102 to the control unit 9 of the overlay measuring instrument 2. As a reaction to a corresponding flag, which is entered in the event database 40, the leading wafer 11 is measured only for the structural width in the overlay measuring instrument 2. The reason is that, in this example, a light-filter change was carried out as maintenance, so that no new adjustment is required. Accordingly, the overlay does not need to be rechecked, only the line width as a possible consequence of a change in dose.

Here, too, the leading wafer 11 is started by a stimulus from the control unit 9 or the event signal 102 transmitted. In dynamic terms, a following second wafer 12 can also be redirected to become a new leading wafer 11 during the generation of an event signal 102, in order to be able to check the new conditions quickly. As a result of the measurement of the only one required structure parameter 30', time is again saved, and by means of the feedback information flow to the control system of the process parameters in the exposure appliance 1, an improvement in the quality of the process is brought about.

The basic progress of this example according to the invention is illustrated in the flow diagram which is shown in FIG. 3b. A check is first made to see whether a system adjustment has been changed at all and, if this is so, which adjustment has been changed. Various types of system changes lead to different structure parameters 30 to be measured. In the example, a light filter change has been carried out, which is designated in this flow diagram as an illuminator change. A leading wafer 11 (send-ahead wafer) is then checked for the structure width. If, on the other hand, the alignment has been changed, then the positional accuracy has to be checked with the send-ahead wafer in an overlay measuring instrument 2. However, a global change still requires a check on all the parameters.

This flow diagram shows that, according to the method of the present invention, the start of leading wafers 11 is initiated. In the case of an advantageous measured result, a process parameter correction can be carried out with the slight deviations obtained, while the production throughput remains unimpaired.

We claim:

1. A method of controlling a process appliance for sequentially processing semiconductor wafers using at least one microscope measuring instrument to determine a quality of a process carried out in the process appliance with at least one process parameter, the method which comprises:

defining a target value and a limiting value for at least one structural parameter relating to structures formed on the wafers;

processing a first wafer in the process appliance;

determining a value for the process parameter while performing the step of processing the first wafer, the process parameter being one of a group consisting of temperature, chemical composition, process duration, intensity, and pressure;

obtaining a result by comparing the value of the process parameter that has been determined with the process limiting value;

generating a warning signal as a function of the result;

transferring the first wafer to the microscope measuring instrument as a function of the warning signal;

in the microscope measuring instrument, obtaining a measured value by measuring a structural parameter of structures on the first wafer, the structures being selected from a group consisting of structures formed during the step of processing the first wafer and structures modified during the step of processing the first wafer;

processing at least a second wafer in the process appliance at a time selected from a group consisting of a time before performing the step of measuring the structural parameter of the structures on the first wafer, and a time while performing the step of measuring the structural parameter of the structures on the first wafer;

obtaining a comparison result by comparing the measured value of the structural parameter of the structures on the first wafer with the target value and the limiting value; and generating a result signal as a function of the comparison result.

2. The method according to claim 1, which comprises based on the result signal, feeding the second wafer to a following process step without feeding the second wafer to the microscope measuring instrument for measuring a structural parameter in between performing the step of processing the second wafer and performing the following process step.

3. The method according to claim 1, which comprises:

combining a plurality of wafers into a plurality of batches, each one of the plurality of the batches having a first wafer;

obtaining a plurality of measured values, representing a plurality of structural parameters, by repeating steps to measure a structural parameter of the first wafer of each one of the plurality of batches;

obtaining a plurality of stored values by storing the plurality of the measured values and associated time markers;

calculating a chronological development of the plurality of the structural parameters from the plurality of the stored values; and depending on a result obtained from the calculating step, generating an event signal.

4. The method according to claim 3, which comprises:

based on the event signal, selecting a structural parameter of a first wafer of a following batch; and in the microscope measuring instrument, measuring the structural parameter of the first wafer of the batch.

5. The method according to claim 3, which comprises feeding the second wafer to the microscope measuring instrument as a new leading first wafer based on the event signal to measure a plurality of structural parameters.

6. The method according to claim 1, which comprises:

processing a plurality of wafers in the process appliance and interrupting the processing of the plurality of the wafers for performing an activity associated with a repair or a maintenance;

generating an event signal as a function of the activity, at the latest when the activity is concluded; and transmitting the event signal to the microscope measuring instrument.

7. The method according to claim 6, which comprises:

based on the event signal, selecting a structural parameter for a first wafer of a following batch; and in the microscope measuring instrument, measuring the structural parameter of the first wafer of the batch.

8. The method according to claim 7, which comprises:

providing the process appliance as an exposure instrument for structuring the plurality of the wafers;

when performing the step of processing the plurality of the wafers, optically projecting visible light to form mask structures on the plurality of the wafers;

when performing the activity associated with the repair or the maintenance, adjusting a wafer stage;

when performing the step of transmitting the event signal, configuring the event signal to include a code for adjusting the wafer stage;

as a response to the event signal, selecting a plurality of structural parameters including a positional accuracy and a plurality of structure widths; and using one or two microscope measuring instruments to measure only the positional accuracy and the plurality of the structure widths.

9. The method according to claim 7, which comprises:

providing the process appliance as an exposure appliance for structuring the plurality of the wafers;

when performing the activity associated with the repair or the maintenance, changing an illumination of the exposure appliance;

when performing the step of transmitting the event signal, configuring the event signal to include a code for changing the illumination;

as a response to the event signal, selecting the structural parameter of the first wafer of the batch to be a structure width; and with the microscope measuring instrument, measuring only the structure width.

10. The method according to claim 6, which comprises feeding the second wafer to the microscope measuring instrument as a new leading first wafer based on the event signal to measure a plurality of structural parameters.

11. The method according to claim 1, which comprises, based the result signal or the warning signal, feeding the second wafer to the microscope measuring instrument as a new leading first wafer to measure the structural parameter.

* * * * *